REACTANCE CONTROLLED TRANSISTOR OSCILLATOR CIRCUIT ARRANGEMENT

INVENTOR.
ROBERT KRAUSZ
JONAS M SHAPIRO
BY Ernest F. Weinberger
ATTORNEY

Nov. 23, 1965 R. KRAUSZ ETAL 3,219,944

REACTANCE CONTROLLED TRANSISTOR OSCILLATOR CIRCUIT ARRANGEMENT

Filed Oct. 30, 1962 4 Sheets-Sheet 2

INVENTOR.
ROBERT KRAUSZ
JONAS M SHAPIRO
BY
Ernest J Weinberger
ATTORNEY

REACTANCE CONTROLLED TRANSISTOR OSCILLATOR CIRCUIT ARRANGEMENT

Filed Oct. 30, 1962 4 Sheets-Sheet 3

INVENTOR.
ROBERT KRAUSZ
JONAS M SHAPIRO
BY Ernest F. Weinberger
ATTORNEY

INVENTOR.
ROBERT KRAUSZ
JONAS M SHAPIRO
BY Ernest F Weinberger
ATTORNEY 3,219,944
Patented Nov. 23, 1965

3,219,944

REACTANCE CONTROLLED TRANSISTOR OSCILLATOR CIRCUIT ARRANGEMENT

Robert Krausz and Jonas M. Shapiro, Stamford, Conn., assignors to the United States of America as represented by the Secretary of the Navy Filed Oct. 30, 1962, Ser. No. 234,266
3 Claims. (Cl. 331—36)

This invention relates to highly stable and accurate oscillators and more particularly to a reactance controlled oscillator.

Although one form or another of reactance circuits suitable for some type of oscillator control have been known, one inherent limitation of these circuits has been that their degree of frequency control is not independent of the oscillator frequency, all other factors remaining constant. In other words, over any appreciable oscillator frequency spectrum the amount of frequency change or shift introduced by the reactance control was not constant over the entire spectrum. This effect in part has been due to the instability of the components and the inability to device a circuit for compensating for the reactive component values affecting the oscillator frequency. Where, as in synthesizers, single side-band equipment and spectrum analyzers both accuracy, stability and precise frequency control are necessary, the presently employed control elements limit in some respects the usefulness of the equipment.

In accordance therewith it is an object of this invention to provide a simple, inexpensive, accurate and precise reactance control circuit which functions equally well over an extended frequency spectrum.

It is a further object of this invention to provide a frequency control circuit for use with a variable frequency oscillator and which introduces a constant change in frequency for a D.C. control bias voltage over at least a 2:1 frequency spectrum.

Other objects and advantages will appear from the following description of an example of the invention, and the novel features will be particularly pointed out in the appended claims.

Figure 1:
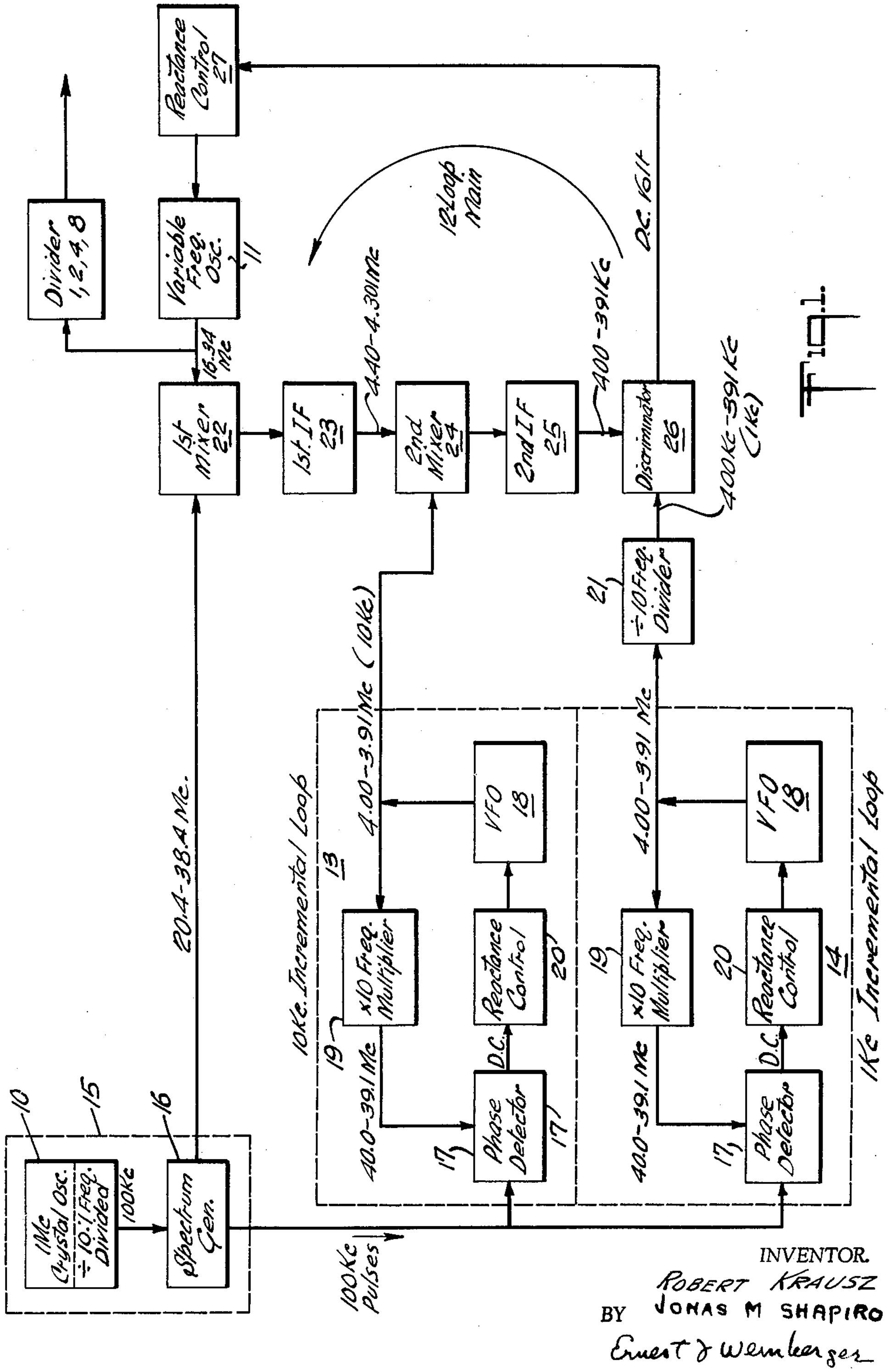
FIGURE 1 is a block diagram representation of a frequency synthesizer employing a control circuit which embodies the principles of this invention.

In the synthesizer of FIGURE 1 the frequency or harmonics generated by the crystal controlled reference or standard 10 are effectively compared with that of the variable frequency oscillator 11 whereby its output frequency exhibits the same relative stability as that of the standard. The synthesizer output comprises a large number of discrete, individual frequencies each of which are separated frequency-wise by a small incremental frequency shift. In order to best describe the function of the reactance control circuit of this invention, it is necessary to outline its relationship to the overall operation of one device in which it may be used, as the above synthesizer. The synthesizer consists of various basic circuits, namely, a double heterodyne main loop 12, a pair of incremental loops 13 and 14, and a frequency generation unit 15. For the sake of simplicity particular frequencies will be used in the following explanation but it should not be construed that the system is so limited. The frequency standard 10, by way of its crystal, generates a 100 kc. signal which is fed into a spectrum generator 16 and therefrom is produced a pair of outputs one being harmonics of the 100 kc. signal between 20.4 mc. and 38.4 mc. and the other merely a series of 100 kc. pulses. The later output is concurrently applied to the phase detector 17 of a pair of incremental loops 13 and 14. Both loops contain variable frequency oscillators 18 whose frequency range extends from 3.91 to 4.00 mc., times 10 frequency multipliers 19 and reactance control circuits 20 which will be subsequently fully described. Since the phase detector inputs are 100 kc. pulses, and some particular frequency within the range of 39.1–40.0 mc. dependent on the setting of the variable frequency oscillator then the phase detector will produce at its output a D.C. bias voltage level dependent on the phase or frequency difference between the particular oscillator frequency and effectively the closest harmonic of 100 kc. This bias voltage when applied to the reactance control circuit 20 causes the control circuit to alter the frequency of the VFO 18 to lock in on the closest effective harmonic of 100 kc. and thereby reduce to D.C. bias voltage of the control. This loop arrangement disciplines the VFO to produce an output frequency in steps of 10 kc. over its range. This is true irrespective of the fact that a 100 kc. pulse was employed since the VFO frequency was multiplied by 10 which, all other factors being constant, is equivalent to employing a 10 kc. pulse without multiplication. The output of loop 14 is provided with a 10:1 frequency divider 21 so that the final loop output consists of 1 kc. steps between 391 kc. and 400 kc. while loop 13 produces an output over the range of 3.91 to 4.00 mc. consisting of 10 kc. steps.

The main loop 12 has in series therein a VFO 11 whose tunable frequency range is 16–34 mc., a first mixer 22, a first intermediate frequency stage 23 which is tuned to pass only frequencies between 4.400 and 4.301 mc., a second mixer stage 24 and a final IF 25 passing only the range of 400 to 391 kc., a frequency discriminator 26 and a main reactance control circuit 27. The synthesizer output is derived from the VFO 11 through a frequency output divider capable of selectively dividing 1, 2, 4 and 8 times to that the output consists in a large number of discrete frequencies between 2 and 34 mc. Considering for the moment, for explanatory purposes, that the VFO 11 has been tuned to some frequency say 16.0 mc., then it will be mixed with that frequency within the spread of the spectrum generator 16 so as to pass through the first IF 23 namely 4.40 mc. If at this dial position of VFO 11, to which VFO's 18 are coupled, their disciplined outputs are 4.00 mc. and 400 kc., respectively, then the second IF 25 will pass 400 kc. which will be concurrently applied with the 1 kc. loop output to the discriminator 26. Since the two discriminator frequency inputs are identical, a minimum bias voltage will appear at the reactance control circuit 27 and the VFO 11 will remain unaltered.

Now in order to obtain the next discrete output frequency the VFO 18 of the 1 kc. loop is shifted slightly downward. This shift must be in steps of 1 kc. so that the next loop frequency is 399 kc. which when applied to the discriminator produces a small D.C. bias voltage due to the frequency differential between 400 and 399 kc. Under the influence of this bias voltage, the reactance control 27 causes the VFO 11 to alter its output frequency by 1 kc. until the second IF stage 25 output frequency is 399 kc. In separate steps this 1 kc. loop goes through its entire cycle (400 kc.–391 kc.) and then repeats for each 10 kc. step of loop 13, so that for each megacycle excursion of the VFO 11 the 10 kc. loop makes a complete cycle and the 1 kc. loop makes ten complete cycles. It is therefore obvious that from 16 mc. to 34 mc. the VFO 11 will be tuned at every 1 kc. step therebetween.

Having generally described the operation of one typical synthesizer and knowing that with the exception of the particular reactance control circuit these components are well known in the art, it is merely necessary to analyze the reactance control circuit. In order to fully appreciate the significance of this invention, it must be realized that the reactance control circuit 27 must be capable of operating throughout the entire frequency range of the oscillator. In other words, for every 1 kc. change in loop 14 there exists a particular bias voltage at control 27 which bias voltage is repeated frequency after frequency throughout the entire VFO 11 range. As illustrative, let us assume that in order to produce a 1 kc. change in the VFO 11 a one volt bias is required. This implies that a one volt bias must produce a $\Delta F$ of 1 kc. at both 16 mc. and 34 mc. which in turn means that the operation of the reactance control must be independent of the VFO frequency. Obviously, this is equally true of all of the reactance controls 20 and 27. In each it is necessary that the frequency change versus D.C. bias voltage should remain constant throughout the whole frequency band.

Figure 2:
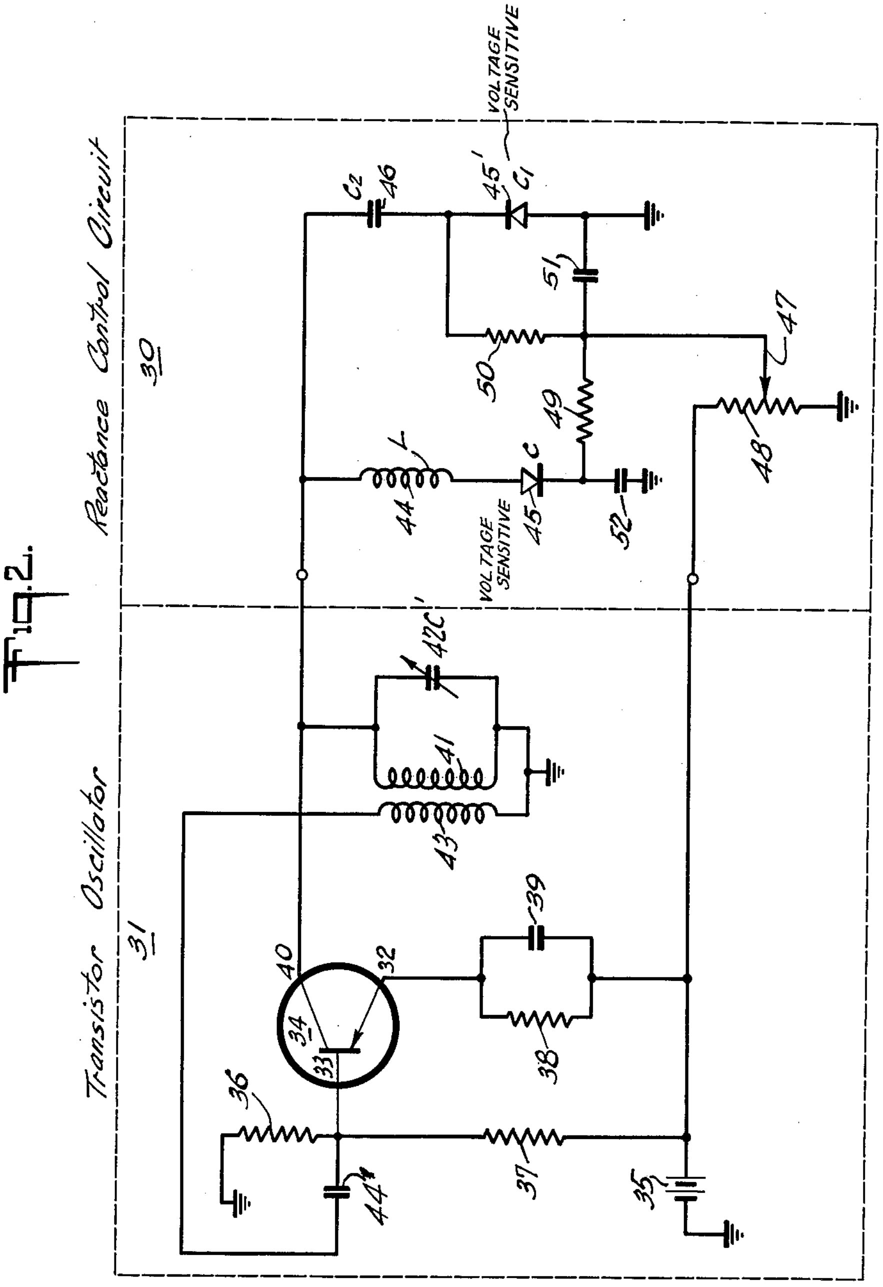
FIGURE 2 is a wiring schematic of a control circuit made in accordance with this invention.
Figure 3:
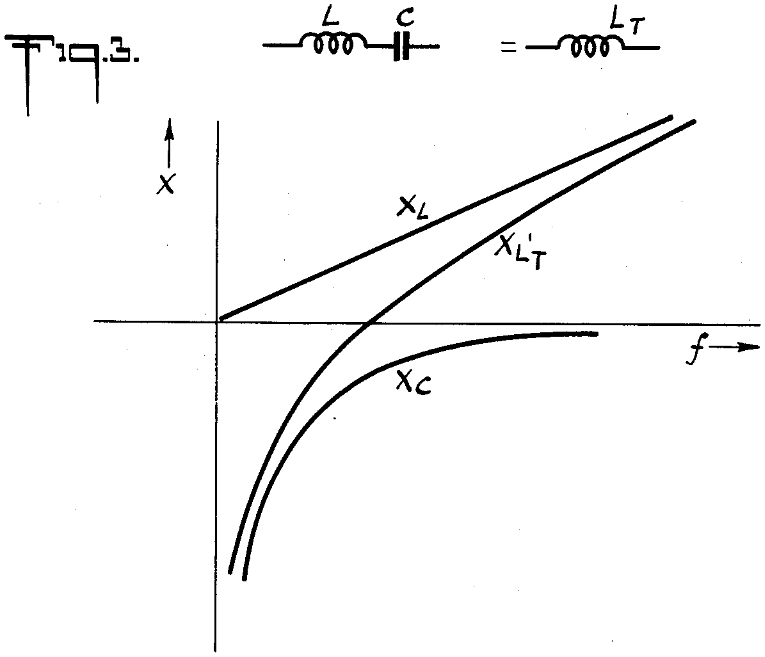
FIGURE 3 is a plot of impedance vs. frequency for an inductor and a back biased diode.

The reactance control circuit 30 of FIGURE 2 is shown in conjunction with a transistor variable frequency oscillator 31 and controls the frequency thereof. The emitter 32 and base 33 of transistor 34 are individually biased from a B+ supply or a battery 35 through biasing resistors 36, 37 and 38. Additionally, the emitter biasing resistor 38 is shunted by bypass capacitor 39. The oscillator output is derived between the collector 40 and ground with a resonant tank circuit comprising inductor 41 and variable capacitor 42 disposed therebetween. Feedback coil 43 is inductively coupled to inductor 41 of the tank circuit and connected by way of coupling capacitor 44' to the transistor base 33 to provide the conventional feedback loop and oscillator operation. The entire foregoing oscillator circuit is conventional and it should be noted that almost any similar form of oscillator can be employed.

By interposing across the tank circuit a reactance, it is clear that the tuning of the tank circuit will be altered and therefore, also, the output frequency. Since any particular reactive element is frequency dependent then by using solely such an element the change in oscillator frequency introduced thereby will not be constant throughout the frequency spectrum of the oscillator.

In providing a circuit for maintaining a constant oscillator frequency shift two reactance branches are parallelled across the tank circuit. One branch has in series therein an inductor 44 and a junction type semiconductor diode 45 which may be of any standard type such as germanium, silicon, etc. Additionally, where extreme sensitivity and extended range are necessary, a voltage sensitive capacitor may be employed. Considering semiconductor diodes it is well known in the art that the application of a reverse voltage across a diode junction (e.g., P-N junction) produces a depletion layer at its boundary. The width of this depleted layer and hence, the junction capacitance is a function of the potential difference across the junction. The second branch contains a capacitor 46 and another diode 45'. Although this branch would be capacitive even without capacitor 46, its use is intended to reduce the RF voltage swing on the diode 45' and to reduce the capacitance change of this diode on the resonant tank circuit due to the biasing voltage. A variable D.C. bias voltage is provided from the center tap 47 of potentiometer 48 across which is connected battery 35. This positive bias voltage is applied to an intermediate point in the inductive branch from the potentiometer center tap via resistor 49 and to the capacitive branch between the capacitor 46 and diode 45' via resistor 50. The positive bias potential is applied to the cathodes of the diodes thereby in effect "back-biasing" them. The anode of diode 45' is grounded directly and also joined to the junction of resistors 49 and 50 by a by-pass capacitor 51. In order to prevent the D.C. bias voltage at the cathode of diode 45 from being grounded while providing an A.C. ground capacitor 52 is inserted therebetween. The first reactance branch is made to resonate at some frequency well below the lowest oscillator frequency whereby throughout the entire range this branch will always present an inductive impedance which is varied by the level of the biasing voltage applied to diode 45 and by the oscillator frequency since the inductor is frequency dependent. The second branch is capacitive and its value depends on the oscillator frequency and bias voltage. With the branches in parallel, the total effect on frequency change due to bias is substantially constant over the frequency spectrum due to the fact that with increasing oscillator frequency the change introduced by the inductive branch is such as to cause a decrease while the capacitive branch causes an increase.

A complete analysis of this can be derived by considering the first branch which contains an inductor 44 (L) and a diode 45 (C) biased to produce an effective capacitance C the combination of which is resonant well below the lower oscillator frequency ($f_1$). The total impedance is always inductive $X_{LT}$ and is equal to $X_{LT}=X_L-X_C$ for frequencies above $f_1$ and becomes $$2\pi f L_T = 2\pi f L - \frac{1}{2\pi f C}$$

where $L_T$ is inductance of the inductive branch and L is inductance of coil 44. Differentiating with respect to C we obtain $$dL_T = \frac{dC}{C^2(2\pi f)^2} \text{ or } K_1\frac{dC}{C^2 f^2}$$

or $$\Delta L_T = K_1\frac{\Delta C}{C^2 f^2}$$

The total inductance in the tank circuit due to the first branch is the parallel combination of $L_T$ and $L_1$ (inductance of coil 41) which is $$L_C = \frac{L_T \times L_1}{L_T + L_1}$$

and $\Delta L_C = K_2 \Delta L_T$.

In general $$\Delta f_L = \frac{f}{2}\frac{\Delta L}{L}$$

that is for any change of inductance the change in frequency attributed thereto is directly related to the frequency and inversely to the inductance.

Since the change in oscillator frequency due to the inductive branch is a result of the capacitance change of the diode 45 then $$\Delta f_{LX} = \frac{f}{2}\frac{\Delta L_X}{L} = K_3\frac{\Delta C}{C^2}\frac{1}{f} = K^6\frac{\Delta C}{f}$$

where $\Delta f_{LX}$ is the change in oscillator frequency due to the inductive branch.

Considering now the capacitive branch where the total capacitance at the tank circuit can be written as $$C_T = C^1 + \frac{C_1 \times C_2}{C_1 + C_2}$$

from which $$C_T \approx K_4 \Delta C_1$$

and since in general for any capacitance $$\Delta f_C = \frac{f}{2}\frac{\Delta C}{C}$$

then $$\Delta f_C = \frac{fa}{2} \times K_4 \frac{\Delta C_1}{C}$$

but since the tank circuit capacitance $C'$ is large, it is very near equal to $C_T$(e.g.$C' \approx C_T$) and $$C^1 = \frac{K_5}{f^2}$$

then $$\Delta f_C = \frac{f}{2} \times K_4 \times \frac{\Delta C_1}{K_5 \times \frac{1}{f^2}} = K_4^1 \cdot \Delta C_1 \cdot f^3$$

combining the changes in oscillator frequency due to both branches we have $$\Delta f_T = \Delta f_C + \Delta f_{L_x}$$

$$= K_4 \Delta C \cdot f^3 + K_6 \frac{\Delta C}{f}$$

Since the same bias voltage is applied to both diodes which are identical then $$\Delta C = \Delta C_1 = \text{constant}$$

and therefore $$\Delta f_T = K_7 f^3 + K_8 \frac{1}{f}$$

assuming now an oscillator frequency range from $f_1$ to $f_2$ where $f_2 = 2f_1$ and a selection of values such that at $f_2$ $$\Delta f_C = \Delta f_T \text{ and } K_7 f_2^3 = K_8 \frac{1}{f_2}$$

and normalizing so that $\Delta f_T = 1$ at $f_2$ then $$K_7 f_2^3 = K_8 \frac{1}{f_2} = \frac{1}{2} \text{ and } K_7 = \frac{1}{2 f_2^3}, \; K_8 = \frac{f_2}{Z}$$

which gives $$\Delta f_T(\text{normalized}) = \frac{1}{2}\left(\frac{f}{f_2}\right)^3 + \frac{1}{2}\left(\frac{f_2}{f}\right)$$

Figure 4:
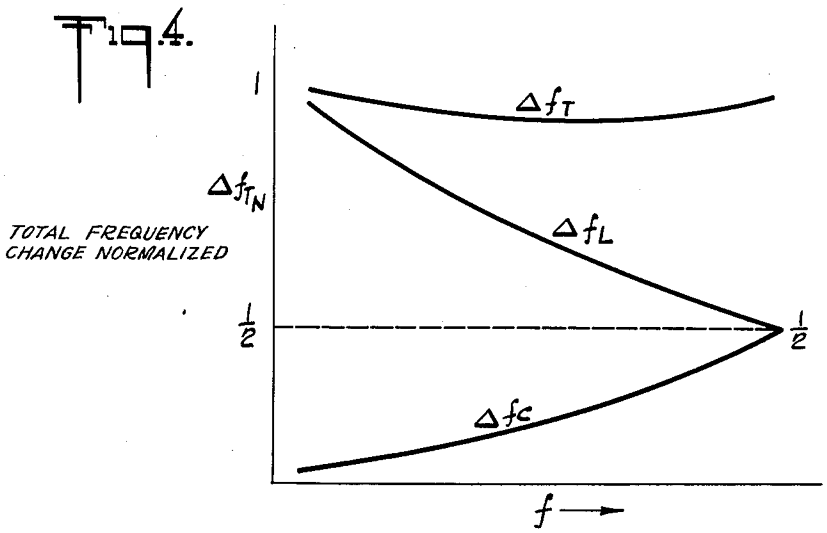
FIGURE 4 is a normalized curve of the frequency changes introduced by the reactance branches and the total change.

This normalized curve has been plotted and illustrated in FIGURE 4 and in order to obtain theoretically the maximum deviation of $\Delta f_T$ we differentiate (normalized) with respect to $f$ and get $$\frac{d\Delta f_{T_n}}{df} = -\frac{1}{2}\frac{f^2}{f^2} + \frac{3}{2}\frac{f^2}{f_2^3}$$

and equate $$\frac{1}{2}\frac{f_2}{f^2} = \frac{3}{2}\frac{f^2}{f_2^3} \quad f^4 = \frac{1}{3} f_2^4$$

or $f = .76^2$ substituting back $$\Delta f_T(\text{normalized}) = \frac{1}{2}\left(\frac{f^2}{.76 f^2}\right) + \frac{1}{2}\left(\frac{.76 f^2}{f^2}\right)^3$$

$$\Delta f_T(\text{normal}) = .88$$

In this respect, a model of this invention was fabricated in accordance with FIGURE 2 covering the frequency range of 16 mc. to 34 mc. The bias voltage on the diodes was varied and measurements were made at every megacycle. That is, the entire frequency spectrum between each megacycle interval was covered by varying the bias so as to obtain all the discrete frequencies therebetween. The results so obtained substantially agreed with the above analysis and the theoretical curve of FIGURE 4 in that the change in frequency was almost constant for any set bias throughout the entire frequency spectrum.

Figure 5:
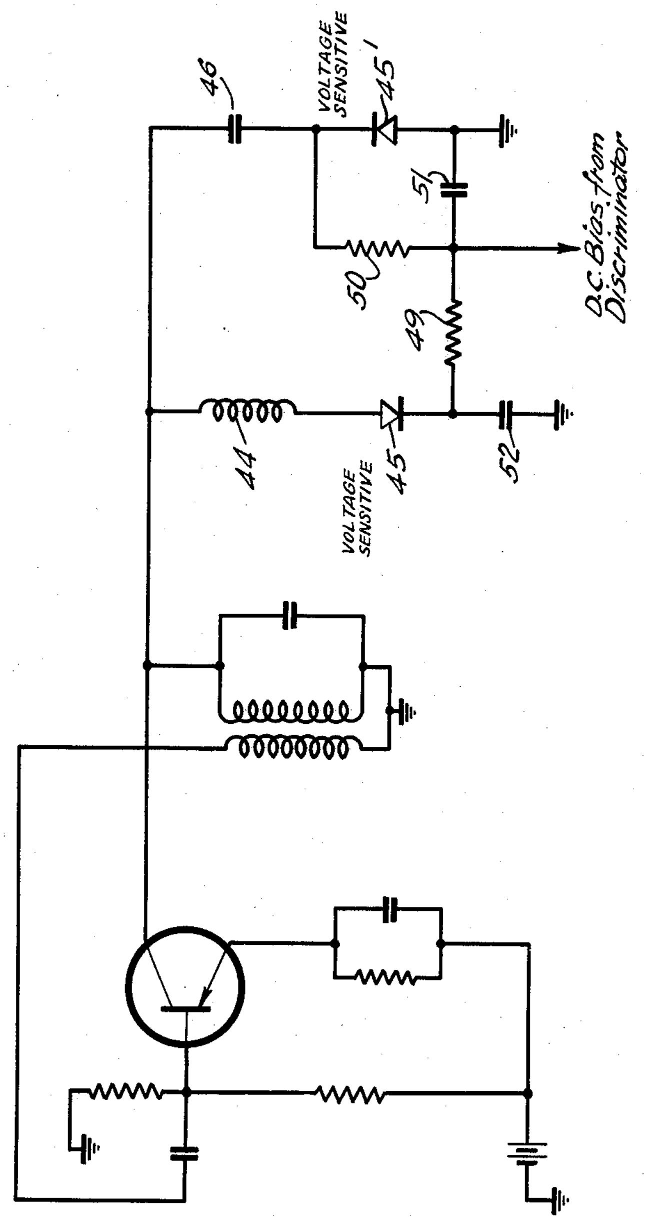
FIGURE 5 is an embodiment made in accordance with this invention and represents the reactance control 27 of FIGURE 1.

The circuit of FIGURE 5 is similar in most respects to that of FIGURE 2 except that the bias voltage for the diodes is obtained directly from the discriminator 26 of FIGURE 1 so that the oscillator frequency is controlled by the main loop 12 feedback.

Summarizing, one observes that the effects are combined in a manner whereby at the upper frequency limit of the oscillator they are equal which upon the addition of the effects of each reactance branch produces an oscillator frequency change ($\Delta f$) that is constant in relation to the D.C. control bias voltage. This is due to the fact that the effect of frequency changes due to the inductive branch and capacitive branch are in opposition. The impedance of each branch is varied by the variation of capacitance of the back-biased diode. The variation in capacitance is brought about by the D.C. control bias voltage and the end result is that $\Delta f$ is substantially constant with D.C. bias over the entire oscillator frequency spectrum.

It will be understood that various changes in the details, materials and arrangements of parts (and steps), which have been herein described and illustrated in order to explain the nature of the invention, may be made by those skilled in the art within the principle and scope of the invention as expressed in the appended claims.

We claim:

1. A circuit for modifying equally, the output frequency of an oscillator throughout its frequency spectrum, said oscillator having as part thereof a reactive tuning circuit said tuning circuit being a tank circuit, which comprises a loop circuit including in series therein an inductor, a pair of semiconductor reversed biased diodes each having an anode and a cathode, a capacitor, an electrical junction between said inductor and said capacitor, the anode of one diode electrically joined to the cathode of the other diode, the cathode of said one diode electrically connected to the free end of said capacitor, the anode of said other diode electrically connected to the free end of said inductor, means connecting said loop circuit at two points across said tank circuit, said two points being said electrical junction and said anode of said one diode, a source of variable D.C. voltage connected concurrently to the cathodes of said diodes to reverse bias said diodes, whereby the output frequency of the oscillator will be modified equally throughout said spectrum.

2. The circuit according to claim 1, further including a source of reference frequency, means for effectively comparing said reference and oscillator frequency and for producing a D.C. output voltage level dependent thereon, and circuit means for applying said D.C. voltage concurrently to the cathodes of said diodes.

3. In a frequency synthesizer of the type wherein the main loop contains a variable frequency oscillator having a tank circuit, a superheterodyne circuit, a frequency discriminator for producing an output D.C. voltage level dependent on the frequency difference between the oscillator frequency and a reference frequency, that improvement which comprises a pair of reactive branches connected across said tank circuit, one of said branches comprising in series connection an inductive element and a semiconductor diode, the other of said branches comprising in series connection a capacitive element and another semiconductor diode, electrical means for applying the output of said discriminator to the cathodes of said diodes with its polarity such that said diodes will be back biased and the oscillator frequency will be altered in accordance with the output of said discriminator.

References Cited by the Examiner

UNITED STATES PATENTS

| | | | |
|---|---|---|---|
| 2,182,377 | 12/1939 | Guanella | 332—30 X |
| 2,964,714 | 12/1960 | Jakubowics | 331—22 X |
| 3,050,693 | 8/1962 | Sinninger | 332—30 X |
| 3,068,427 | 12/1962 | Weinberg | 332—30 |

FOREIGN PATENTS

| | | |
|---|---|---|
| 612,264 | 1/1961 | Canada. |
| 1,087,643 | 8/1960 | Germany. |

ROY LAKE, *Primary Examiner.*

JOHN KOMINSKI, *Examiner.*